United States Patent
Ausschnitt et al.

(10) Patent No.: US 9,257,351 B2
(45) Date of Patent: Feb. 9, 2016

(54) METROLOGY MARKS FOR BIDIRECTIONAL GRATING SUPERPOSITION PATTERNING PROCESSES

(71) Applicant: International Business Machines Corporation, Armonk, NY (US)

(72) Inventors: Christopher P. Ausschnitt, Naples, FL (US); Nelson M. Felix, Briarcliff Manor, NY (US); Scott S. Halle, Slingerlands, FL (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 7 days.

(21) Appl. No.: 13/968,336

(22) Filed: Aug. 15, 2013

(65) Prior Publication Data

US 2015/0050755 A1   Feb. 19, 2015

(51) Int. Cl.
*G03F 7/26* (2006.01)
*H01L 21/66* (2006.01)
*G03F 7/20* (2006.01)

(52) U.S. Cl.
CPC ............ *H01L 22/12* (2013.01); *G03F 7/70633* (2013.01); *H01L 22/30* (2013.01)

(58) Field of Classification Search
CPC ....................................................... G03F 9/00
See application file for complete search history.

(56) References Cited

U.S. PATENT DOCUMENTS

| | | | |
|---|---|---|---|
| 4,423,959 A | 1/1984 | Nakazawa et al. | |
| 5,087,537 A | 2/1992 | Conway et al. | |
| 5,666,205 A | 9/1997 | Tateno et al. | |
| 5,721,619 A | 2/1998 | Hiruma et al. | |
| 6,545,284 B1 | 4/2003 | Masuyuki et al. | |
| 6,855,464 B2 | 2/2005 | Niu et al. | |
| 7,180,189 B2 | 2/2007 | Bowes | |
| 7,193,715 B2 | 3/2007 | Smedt et al. | |
| 7,375,810 B2 | 5/2008 | Nikoonahad et al. | |
| 7,528,941 B2 | 5/2009 | Kandel et al. | |
| 7,599,064 B2 | 10/2009 | Mos et al. | |
| 7,911,612 B2 | 3/2011 | Kiers et al. | |
| 8,107,079 B2 | 1/2012 | Ausschnitt et al. | |
| 8,278,770 B2 | 10/2012 | Yang | |
| 2005/0189502 A1* | 9/2005 | Van Bilsen et al. | 250/559.3 |
| 2007/0159622 A1 | 7/2007 | Moest et al. | |
| 2009/0096116 A1 | 4/2009 | Yang | |
| 2010/0321654 A1 | 12/2010 | Den Boef | |
| 2012/0033215 A1 | 2/2012 | Kandel et al. | |
| 2012/0044470 A1 | 2/2012 | Smilde et al. | |

OTHER PUBLICATIONS

IPCOM000100212D: "Interferometric Method of Checking the Overlay Accuracy in Photolitho Graphic Exposure Processes" IBM TDB n10b 03-90 p. 214-217.

(Continued)

*Primary Examiner* — Kathleen Duda
(74) *Attorney, Agent, or Firm* — DeLio, Peterson & Curcio, LLC; Kelly M. Nowak

(57) ABSTRACT

Cut spacer reference marks, targets having such cut spacer reference marks, and methods of making the same by forming spacer gratings around grating lines on a first layer, and fabricating a template mask that extends across and perpendicular to such spacer gratings. Cut spacer gratings are etched into a second layer using the template mask to superimpose at least a portion of the spacer gratings of the first layer into the second layer.

19 Claims, 13 Drawing Sheets

(56) References Cited

OTHER PUBLICATIONS

IPCOM000223274D: "Maskless definition of aligned (zero overlay) fiducial mark within SIT process flow" Disclosed Anonymously Nov. 15, 2012.

IPCOM000099986D: "Phase-Sensitive Overlay Analysis Spectrometry" IBM TDB n10a 03-90 p. 170-174.

IPCOM000207316D: "Co-centric Alignment and Overlay Target" IBM TDB 05, 2011 pp. 1-5.

* cited by examiner

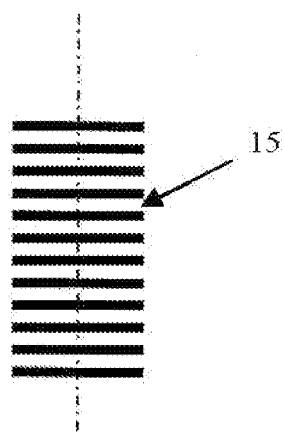
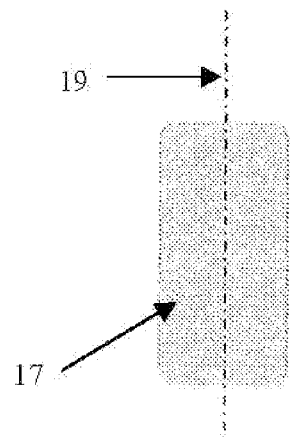
FIG. 1A
PRIOR ART
FIG. 1B
PRIOR ART
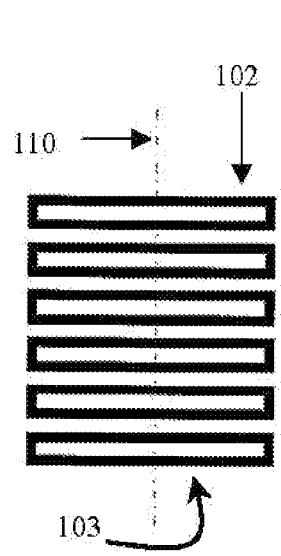
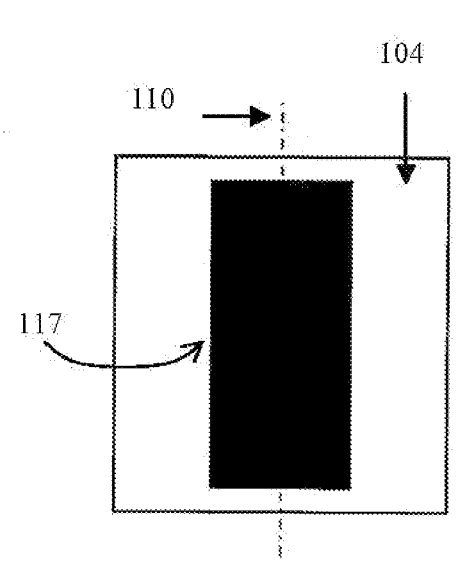
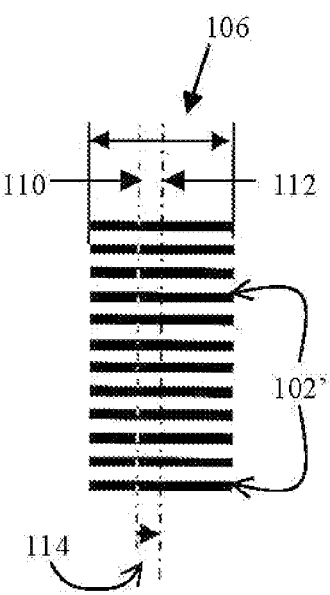
FIG. 2A
FIG. 2B
FIG. 2C

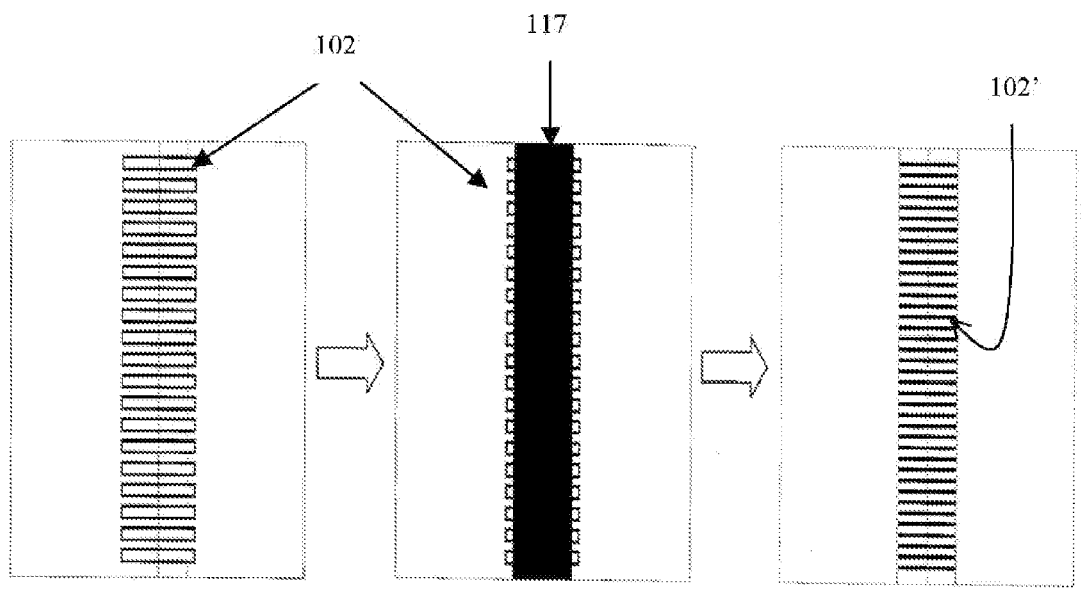
FIG. 3A  FIG. 3B  FIG. 3C
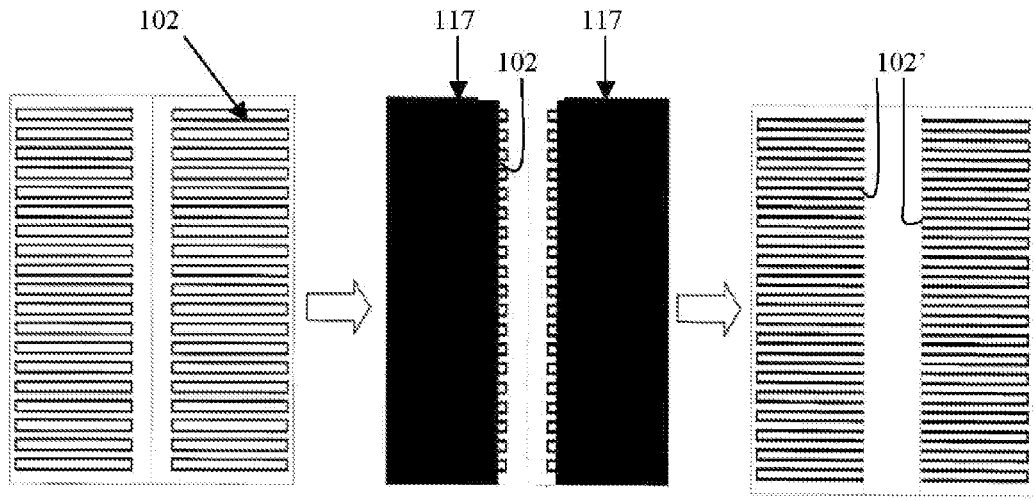
FIG. 4A  FIG. 4B  FIG. 4C

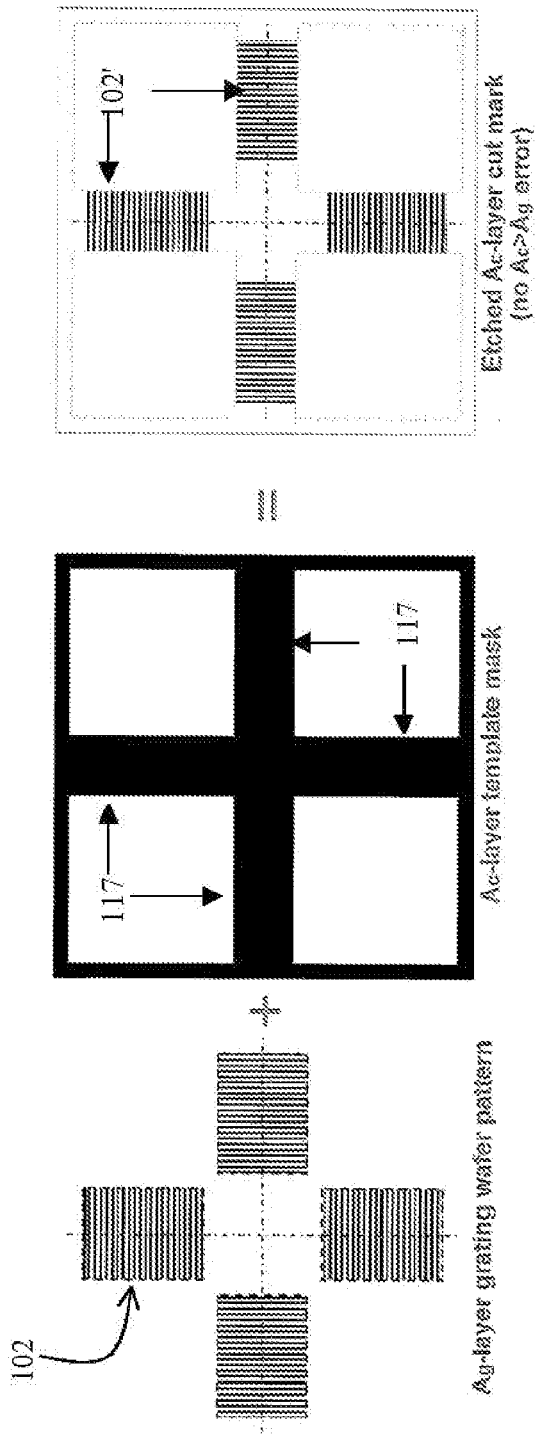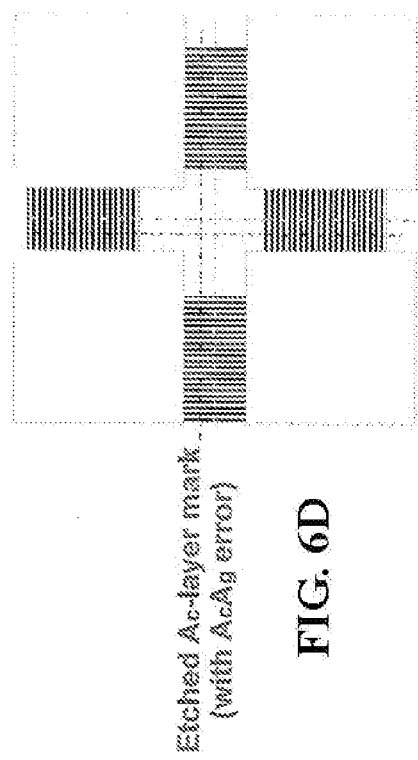
FIG. 6A  FIG. 6B  FIG. 6C  FIG. 6D

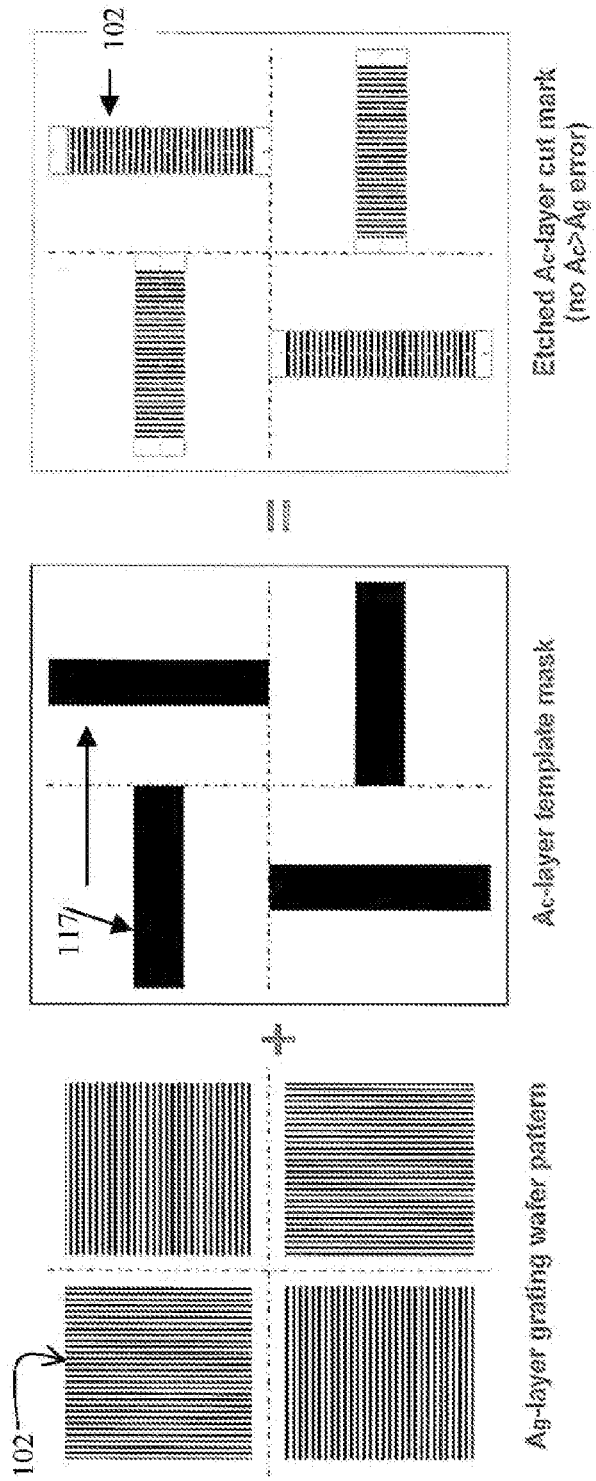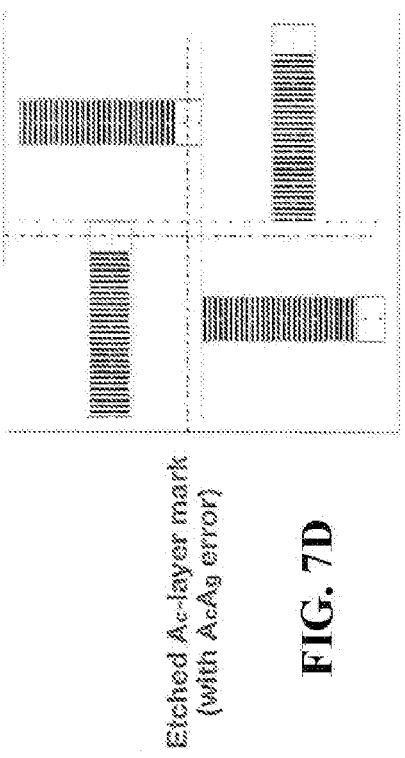
FIG. 7A  Ag-layer grating wafer pattern
FIG. 7B  Ac-layer template mask
FIG. 7C  Etched Ac-layer cut mark (no Ac>Ag error)
FIG. 7D  Etched Ac-layer mark (with AcAg error)

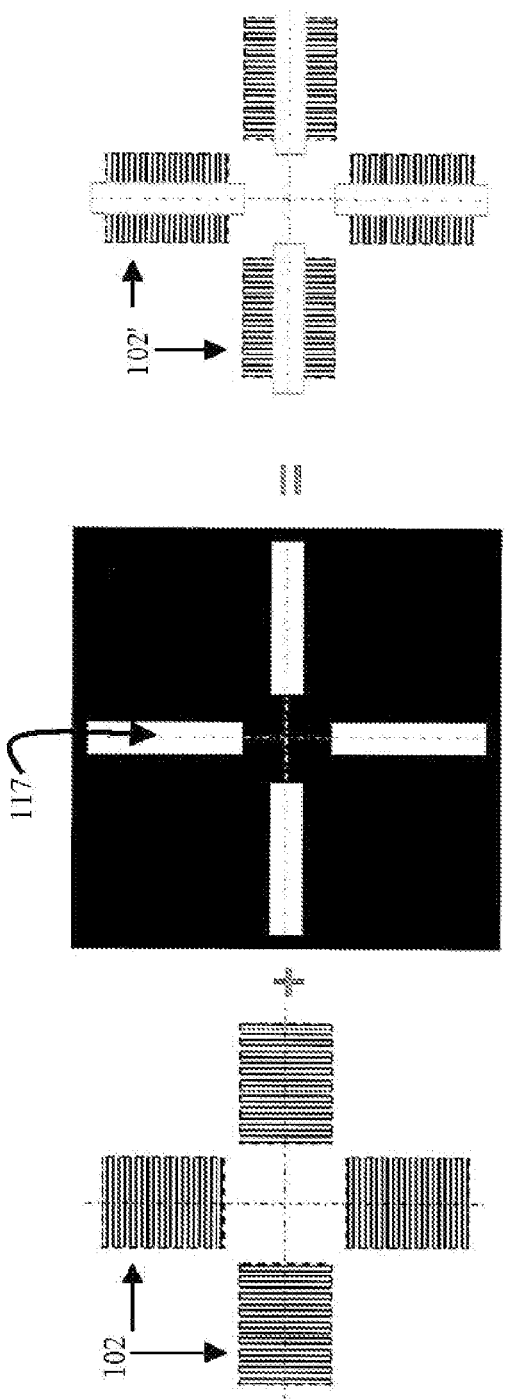
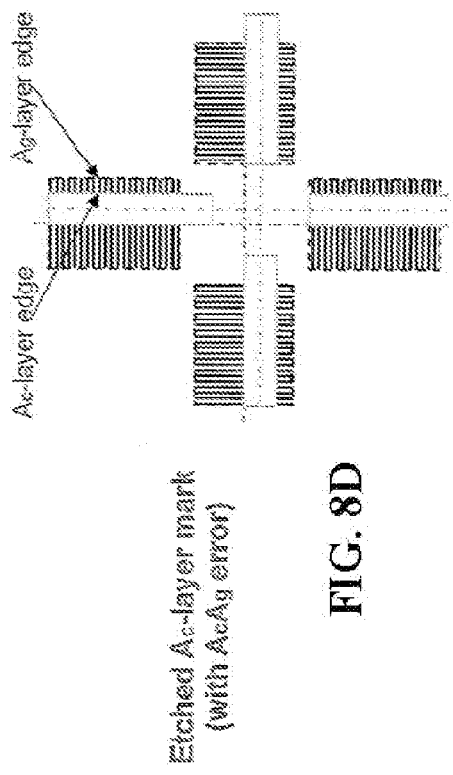
FIG. 8A  Ag-layer grating wafer pattern
FIG. 8B  Ac-layer template mask
FIG. 8C  Etched Ac-layer cut mark (no Ac>Ag error)
FIG. 8D  Etched Ac-layer mark (with AcAg error)

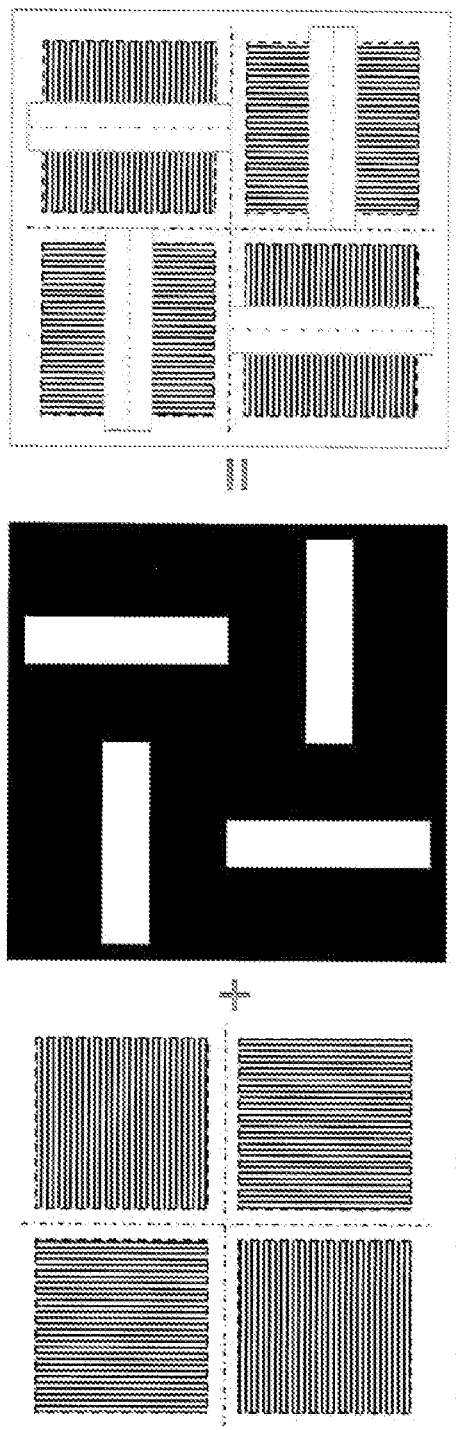

| Bc | Bg | Ac | Bc |
|----|----|----|----|
| Ac | Ag | Ag | Bg |
| Bg | Ag | Ag | Ac |
| Bc | Ac | Bg | Bc |

METROLOGY MARKS FOR BIDIRECTIONAL GRATING SUPERPOSITION PATTERNING PROCESSES

RELATED APPLICATIONS

The present invention relates to U.S. patent application Ser. No. 13/968,348, entitled "METROLOGY MARKS FOR UNIDIRECTIONAL GRATING SUPERPOSITION PATTERNING PROCESSES," having the same filing date as the instant application, the disclosures of which is hereby incorporated by reference in its entirety.

BACKGROUND

Semiconductor manufacturing requires the sequential patterning of process layers on a single semiconductor wafer. Lithographic exposure tools known as steppers or scanners print multiple integrated circuit patterns or fields (also known as product cells) by lithographic methods on successive layers of the wafer. These exposure tools transfer patterns of a photo mask having customized circuit patterns to thin films formed on a wafer. In doing so, different layers are patterned by applying step and repeat lithographic exposure or step and scan lithographic exposure, in which the full area of the wafer is patterned by sequential exposure of the stepper fields containing one or more integrated circuits.

The image transfer process comprises steps of forming a photoresist layer on a non-process layer, illuminating the photoresist layer through a photo mask having the customized circuit patterns, developing the photoresist layer and then etching the non-process layer by using the patterned photoresist layer as a mask to accomplish the image transfer process. This image transfer process is performed several times to transfer the circuit patterns to each non-process layer to form the integrated circuit device. Typically, 20-50 layers are required to create an integrated circuit.

In order to match corresponding features in successive lithographic process layers on the semiconductor wafer, it is important to keep both alignment and overlay error as small as possible and within predetermined limits. Measurements are typically performed using metrology imaging tools, such as optical, scanning e-beam or atomic force microscopy systems. In practice, alignment and overlay metrology systems often require different specialized target designs and locations on each layer.

Alignment is the position of an existing wafer target with respect to the exposure tool. Alignment error is the deviation of the location of the wafer target from its designed location, as determined by the alignment system of the exposure tool. Alignment to an existing layer (the aligned-to layer) is followed by the exposure that prints a new layer.

Overlay targets can be comprised of sub-patterns from both the same and different masks. The images are analyzed to determine the relative layer-to-layer and within-layer placement of the sub-patterns among the various mask layers printed on the wafer. Overlay error is the deviation of the relative position among patterns from their designed relative positions, as determined by an overlay metrology tool. In doing so, the overlay correlation set in an exposure tool is used to insure alignment precision between the successively patterned layers. A metrology process determines precision of the overlay alignment by referring to the overlay alignment mark sets of the successive patterned layers.

To ensure circuit functionality, overlay errors must be minimized among all wafer patterns, consistent with the ground rules of the most critical circuit devices. While prior art has focused on several metrology processes for determining overlay alignment, as semiconductor device critical dimensions continue to shrink, and the speed and functionality requirements thereof continue to increase, improvements continue to be needed in minimizing alignment and overlay errors.

That is, a need exists in the art for methods, apparatus and structures that align successively patterned layers to reduce misalignment errors as critical dimensions of semiconductor devices continue to shrink and the processing requirements thereof continue to develop.

SUMMARY

According to one embodiment of the present invention, the invention is directed to a method of fabricating reference marks for lithography by providing grating lines on a first layer and forming spacer gratings around the grating lines. A template mask is formed extending across and perpendicular to the spacer gratings. A second layer is then etched using the template mask to superimpose at least a portion of the spacer gratings of the first layer into the second layer, thereby forming cut spacer gratings in the second layer.

In another embodiment of the invention is directed to a method of determining positioning error between lithographically produced integrated circuit fields. The method includes providing grating lines on a first layer, forming spacer gratings around the grating lines, and forming a template mask extending across and perpendicular to the spacer gratings. The second layer is etched using the template mask to superimpose at least a portion of the spacer gratings of the first layer into the second layer, thereby forming cut spacer gratings in the second layer. A position of the cut spacer gratings in the second layer may then be measured relative to the grating lines on the first layer to determine any alignment error.

In still another embodiment, the invention is directed to an overlay target for lithography that includes an aggregated array of multi-layer overlay targets comprising one or more bi-directional cut spacer grating layers. The one or more bi-directional cut spacer grating layers are formed by providing grating lines on a first layer and forming spacer gratings around the grating lines. A template mask is formed extending across and perpendicular to the spacer gratings. A second layer is then etched using the template mask to superimpose at least a portion of the spacer gratings of the first layer into the second layer, thereby forming cut spacer gratings in the second layer. The one or more bi-directional cut spacer grating layers may be formed using negative tone lithography, positive tone lithography, or combinations thereof.

BRIEF DESCRIPTION OF SEVERAL VIEWS OF THE DRAWINGS

FIGS. 1A-B are prior art illustrations of grating lines and optical contrasts on a processing layer.

FIGS. 2A-C illustrate a process for fabricating cut spacer gratings using spacers and perpendicular template masks in accordance with the various embodiments of the invention.

FIGS. 3A-C illustrate another process flow for forming cut spacer gratings using doubling spacers, and template masks perpendicular to such spacers, in accordance with the invention.

FIGS. 4A-C illustrate yet another process flow for forming cut spacer gratings using doubling spacers, and template masks perpendicular to such spacers, in accordance with the invention.

FIGS. 6A-D illustrate positive tone cross configuration embodiments of the invention for forming cut spacer gratings in accordance with the invention.

FIGS. 7A-D illustrate positive tone pinwheel configuration embodiments for forming cut spacer gratings in accordance with the invention.

FIGS. 8A-D illustrate negative tone cross configuration embodiments for forming cut spacer gratings in accordance with the invention.

FIGS. 9A-D illustrate negative tone pinwheel configuration embodiments for forming cut spacer gratings in accordance with the invention.

FIGS. 12-16 show various aggregate multiplayer overlay targets made in accordance with the one or more embodiments of the present invention.

DETAILED DESCRIPTION

Figure 5:
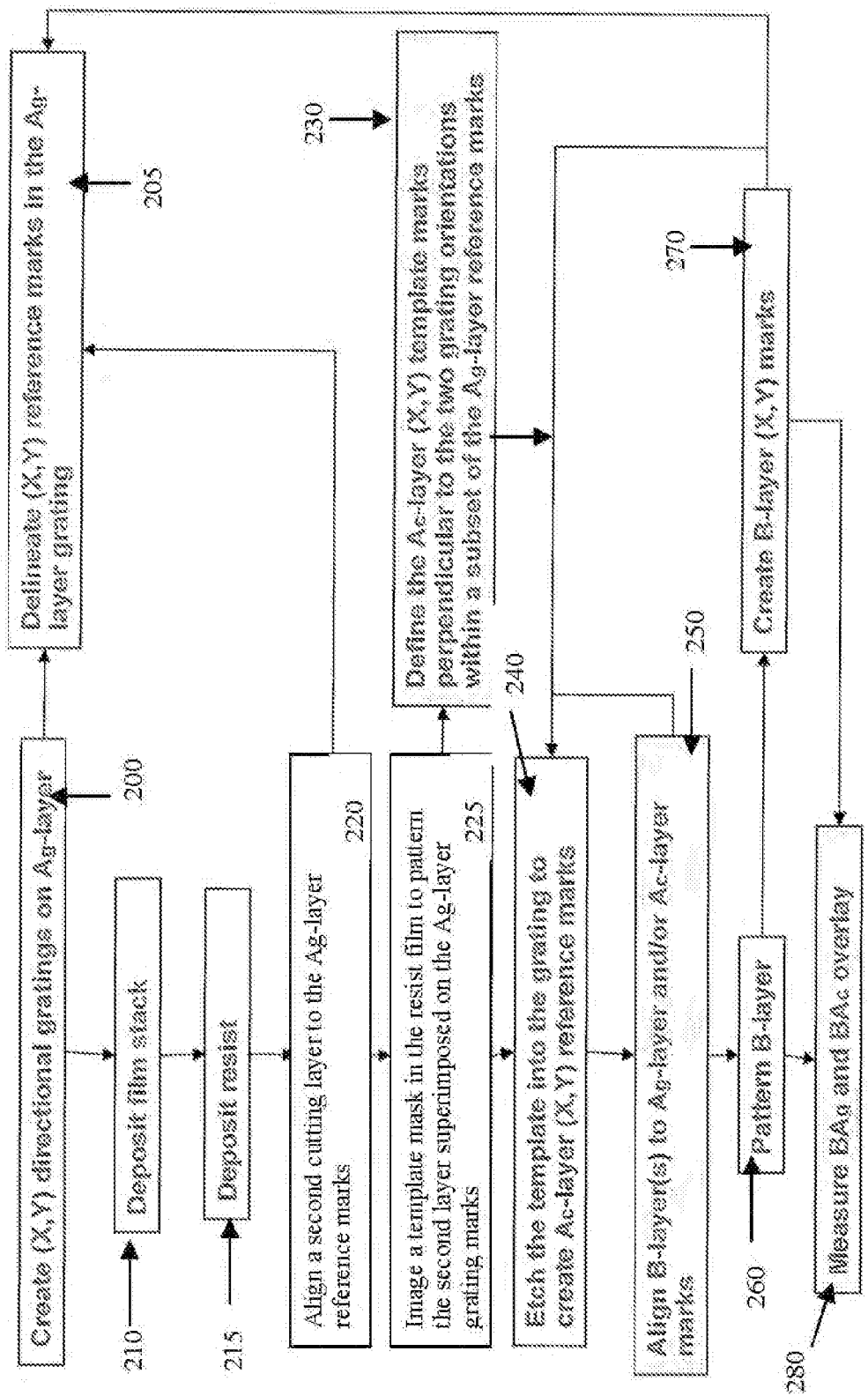
FIG. 5 depicts a process flow in accordance with one or more embodiments of the invention.

Advanced semiconductor manufacturing processes include layers patterned with high frequency line or space gratings. These lines and gratings are formed using lithographically defined mandrels and frequency multiplying process steps including, but not limited to, Sidewall Image Transfer (SIT), Sidewall Image Dielectric (SID), Directed Self Assembly (DSA), and the like. Complex circuit patterns are then formed using multiple superimposed masking layers of positive and/or negative tone to subtract or "cut" regions of the grating pattern. The fabrication of functional devices requires the measurement and control of the relative position among these superimposed layers to within sub-1 nm precision. Thus, alignment and overlay reference marks measurable by optical metrology systems need to be formed on each of the superimposed layers using shapes defined solely by cut regions of the grating pattern.

Current and future semiconductor manufacturing processes often require forming bidirectional grating cut layers of very fine grating marks by techniques including, but not limited to, SIT, SID, DSA, and the like. These bidirectional cut layers are gratings formed and cut in two directions, typically, in X-, Y-orthogonal directions.

For instance, FIG. 1A shows prior art segmented reference or grating marks (or lines) 15 on a first layer. These grating marks 15 may be formed by developing and/or etching grating patterns into an unpatterned film on the first layer. Pattern contrasts may increase with pattern duty cycle. A center-line 19 location of the grating marks 15 is determined using the contrast between patterned and unpatterned regions on the first layer, and such centerline 19 location is marked. This centerline mark identifies the position of the grating marks 15 on the first layer.

For purposes of alignment or overlay metrology, since the grating marks 15 have a sufficiently high spatial frequency, the alignment system of the overlay metrology system often has difficulty in detecting the individual grating lines. FIG. 1B shows an optical contrast of such grating marks 15 at a pitch of less than about metro $\lambda/2NA$. As is shown, the gray rectangle 17 depicts an outline or a contrast change between the surrounding area and the region of the first layer having the segmented grating marks 15.

As device complexity and intricacy increase with future generations of semiconductors and semiconductor technologies, a need exists for more complex patterns and methods of making the same for fabrication of current and future generations of electronic devices. With these more complex patterns and methods of making the same, needs also exist in the art for improvements in alignment or overlay metrology approaches.

In accordance with the various embodiments of the invention, overlay marks and methods for forming the same are provided for both current and future semiconductor and electronic device fabrication. Referring to FIGS. 2A-C of various embodiments of the invention, bi-directional 90° cut grating marks are provided by first forming grating marks 15 (e.g., as in FIG. 1A) followed by forming spacers 102 on a first layer. FIG. 2A shows spacers 102 after SIT or SID processing.

These spacers 102 are formed on the sides of grating marks 15 so that the frequency thereof is doubled on the first layer (i.e., two (2) spacers are provided for every grating pattern line 15). In doing so, reference marks of a second layer are formed by etching template patterns into grating patterns on the first layer. The template edges are bi-directional cut gratings each oriented at 90° to its respective grating mark. The spacers 102 replace the grating mark 15. While doubling spacers 102 are depicted, it should be appreciated that the invention is also suitable for use with quadrupled frequencies, or even more, whereby additional spacers are formed on the sides of spacers 102.

Referring to FIG. 2B, a template mask of the etched region 117 is formed using the optical contrast between the etched doubling spacers 102 and the unetched region 104. The template mask of the etched region 117 is shown in FIG. 2B as the black rectangle depicting an outline or a contrast change of the doubling spacers 102. It should be appreciated that the contrast increases with both increased mandrel frequency and sidewall thickness. A centerline location 110 of spacers 102 is also determined using the optical contrast, whereby this centerline location 110 determines the position of the mark on the second layer.

While FIG. 2B shows the template mask of the etched region 117 in a single direction (e.g., the Y-direction), it should be appreciated and understood that the template mask of the etched region 117 may be formed in both the X-direction and/or Y-direction. The X- and/or Y-direction template mask(s) 117 are formed at 90° angles with respect to a length of each original grating mark 15 and/or doubling spacer 102. As shown in FIG. 2A the length 103 of each doubling spacer 102 is perpendicular to the template mask of the etched region 117 (or at a 90° angle therewith).

After the second layer mask of FIG. 2B is formed, each cut spacer 102 surrounds a region where a grating pattern line 15 resided. As described herein the spacers 102 are shown as having a geometric rectangular shape, however, it should be appreciated that the spacers may be provided with any geometric shape that is formed by doubling, quadrupling, or more, the frequency of one or more grating mark(s) or line(s). In accordance with the various embodiments of the invention, using the developed second layer template mask 117 of FIG. 2B, the second layer is etched to superimpose a portion of spacers 102 into the second layer to form bi-directional 90° cut spacers 102' in the second layer.

In particular, referring to FIG. 2C, after etching the second layer using the template mask of the etched region 117, the second layer is provided with superimposed cut spacers 102' that have been cut at 90° angles with respect to lengths 103 of each doubling spacer 102. As such, only a portion of the doubling spacers 102 from the first layer have been transferred into the second layer to form cut spacer reference marks 102' (i.e., a portion of the doubling spacers 102 from the first layer have been removed or cut by the 90° angle template mask). Referring to FIGS. 3A-C, in one or more embodiments at least the edges or ends of spacers 102 are cut from the superimposed spacers 102' in the second layer. Also referring to FIGS. 4A-C, one or more template masks 117 may be used simultaneously to remove at least a portion of spacers 102 to result in cut spacers 102'.

As shown in FIG. 2C, the resultant superimposed 90° cut spacers 102' may have a different centerline location 112 than that of spacers 102 centerline 110. Overlay error and/or misalignment 114 may be determined and calculated from such centerline location differences. While it should be appreciated that the 90° angle template mask may reside in a single 90° direction (e.g., a uni-directional X- or Y-direction), the invention is also directed to bi-directional 90° angle template masks residing in both the X- and Y-directions. In those embodiments where the template masks 117 reside in both X- and Y-directions, bi-directional 90° cut spacers 102' are formed in the second layer.

Referring to FIG. 5, one or more embodiments of methods are shown for forming uni-directional and/or bi-directional 90° cut spacers 102' of the invention. In accordance with the various embodiments, permanent spacers 102 are formed on a first spacer layer by forming the X,Y directional gratings on such first layer, referred to herein as Ag-Layer (A-grating spacer layer) (step 200). The resultant X,Y directional reference marks or spacers of the Ag-Layer may be delineated in the first spacer layer grating (step 205). A film stack is then deposited over the Ag-Layer (step 210), followed by deposition of a resist (step 215).

A second layer that is to be cut is aligned to the Ag-Layer (step 220) over the resist film. A template mask is lithographically imaged in the resist to pattern the second layer that is superimposed over the Ag-Layer grating marks (step 225). The second layer X,Y template marks (i.e., etched regions 117) reside at 90° angles with respect to lengths of the spacers 102. The X-direction and/or Y-direction template marks superimpose resist shapes at one or more grating locations whose edges span multiple periods of the grating in a direction perpendicular to the orientation of the spacer grating line lengths 103 (step 230). That is, the X,Y template marks are formed perpendicular to the spacer grating orientations within a subset of the Ag-layer reference mark.

The template mask includes optical contrast regions of etched regions 117 (which may be dark/positive regions or light/negative regions) that preferably cover the double frequency spacers 102. The template mask is etched into the second layer to provide resultant etched cut spacers 102' in this gratings layer, namely, Ac-Layer (A-cut Layer). The Ac-Layer has X-directional and/or Y-directional 90° cut spacer X,Y reference marks 102' (step 240). The etched cut spacer Ac-Layer, having cut spacers 102', has portions of spacers 102 removed or cut away via the etching process as compared to the spacers 102 of the spacer Ag-Layer.

In continuing with the process flow, once the Ac-Layer has been formed, a next subsequent layer (e.g., a B Layer) may be processed (step 250). At this stage, the B Layer may be aligned to first spacer Ag-Layer reference marks, the second etched cut spacer Ac-Layer reference marks, or even both (step 250). The B Layer may be patterned using the first Ag-Layer reference marks and/or second etched Ac-Layer reference marks (step 260), followed by forming the B Layer X,Y reference marks (step 270). Alternatively, or in combination therewith, overlay error may be measured for the B Layer in comparison to the spacer Ag-Layer reference marks (i.e., B-Ag overlay) and/or the second etched cut spacer Ac-Layer reference marks (i.e., B-Ac overlay) (step 280). In doing so, overlay error is determined and controlled between the resist shapes on the B Layer with respect to the Ag- and/or Ac-Layer to which it is being compared against.

In addition to the foregoing, overlay error may be determined and compared between the spacer Ag-Layer reference marks (i.e., B-Ag overlay) and the cut spacer Ac-Layer reference marks (i.e., B-Ac overlay), as shown at least on FIG. 2C. In doing so, the centerline location 110 of spacer 102 Ag-Layer reference marks is compared against the centerline location 112 of cut spacers 102' Ac-Layer reference marks.

In accordance with the various embodiments of the invention, the methods and cut lines of the invention enable controlling the device functionality by controlling the cut layer that define edges of such device. Various embodiments of the invention provide measurement and control of the positioning of subsequent layers to spacer layers, as well as sidewall image transfers. As such, once a Ac-Layer having cut spacer 102' reference marks has been formed, a next subsequently processed layer can align back the first doubling spacer Ag-Layer, or align back to the cut spacer Ac-Layer.

The various methods of the invention may be applied in forming a number of different grating patterns as shown in FIGS. 6A-16. Referring to FIGS. 6A-D, a positive tone (PT) cross pattern resist is performed in accordance with the invention. As is shown doubling spacers 102 are formed in a first Ag-layer grating wafer pattern (FIG. 6A), followed by forming a bi-directional positive tone template mask 117 that extends in both the X- and Y-directions (FIG. 6B). This bi-directional template mask 117 has a cross shape configuration. Using the bi-directional template mask 117, a second layer is etched to provide bi-directional 90° cut spacers 102' within such second layer (FIG. 6C). In etching the second layer, regions of the layer covered by the black resist are not etched and remain after etch completion.

In accordance with the invention, the etched Ac-Layer having cut spacers (or reference marks) 102' may have no alignment or overlay measurement error (see, FIG. 6C). Alternatively, alignment or overlay measurement error may exist in the Ac-Layer (see, FIG. 6D). That is, when the template mask 117 moves off center with respect to the first Ag-layer, misregistration of the second etched Ac-Layer occurs with respect to the first Ag-layer. The measurable centerlines along the arms of the cross shown in FIG. 6C are defined by the Ac-layer template. As the Ac-layer reference marks 102' shift relative to the Ag-layer reference marks 102, the marks become asymmetric which results in measurable alignment or overlay error between the Ac- and Ag-Layers as shown in FIG. 6D.

FIGS. 7A-D show a positive tone (PT) pinwheel configuration that provides measurable length in the lines in two orientations that are essentially symmetric with respect to each other. In the pinwheel configuration doubling spacers 102 are formed in a first Ag-layer grating wafer pattern (FIG. 7A) in a pinwheel type pattern. The bi-directional template masks 117 are formed extending in both X- and Y-directions (FIG. 7B) in the pinwheel pattern relative to positioning placement of the doubling spacers 102. Using the bi-directional pinwheel pattern template mask 117, a second layer is etched to provide bi-directional 90° cut spacers 102' in the second layer (FIG. 7C).

These cut spacers 102' reside in locations corresponding to regions where the pinwheel patterned dark resist regions resided (i.e., uncovered regions (i.e., exposed white regions in the figures) were removed or cut away during the etch process). As shown in FIG. 7C, the etched Ac-Layer with pinwheel patterned cut spacers 102' may have no alignment or overlay measurement error, or alternatively, as shown in FIG. 7D alignment or overlay measurement error may exist in the Ac-Layer (i.e., AcAg Layer overlay or misalignment error may exist).

Various embodiments of the invention may also be utilized with negative tone (NT) resist patterning and development. Like that described above in connection with the positive tone (PT), both cross patterns and pinwheel patterns may be used with negative tone (NT) resist patterning to provide patterned cut spacers 102' in accordance with the invention.

Referring to FIGS. 8A-8D, doubling spacers 102 are formed in a first Ag-layer grating wafer cross pattern (FIG. 8A), and a bi-directional negative tone template mask 117 is formed in a cross pattern (FIG. 8B). The bi-directional negative tone template mask 117 exposes the light regions (i.e., white regions) shown in FIG. 8B, while the covered dark regions (i.e., black regions) are protected or not removed during the etch process. Using the bi-directional negative tone template mask 117, a second layer is etched to provide bi-directional 90° cut spacers 102' within such second layer (FIG. 8C). In the negative tone embodiments, the doubling spacers 102 may be cut or split in two to provide split cut spacers 102'. As shown in FIG. 8D, in one or more embodiments these split cut spacers 102' may have inner edges along the arms of the cross configuration that are defined by the Ac-layer cut, while the outer edges are defined by the Ag-layer grating. The proximity of the Ac-layer and Ag-layer edges may be measured by metrology.

In the negative tone pinwheel configuration shown in FIGS. 9A-D, the doubling spacers are formed in the Ag-layer grating wafer pattern (FIG. 9A), and a bi-directional negative tone template mask 117 is formed in a pinwheel configuration (FIG. 9B). The size of the negative tone (i.e., white regions) may vary depending upon the desired end result device, and may expand across the Ag-layer quadrants having spacers 102. A second layer is etched using the negative tone pinwheel pattern template mask to provide bi-directional 90° cut spacers 102' in the second Ac-Layer (FIG. 9C).

No alignment or overlay measurement error may exist in these etched pinwheel patterned spacers 102' in the Ac-Layer (FIG. 9C), or alternatively, alignment or overlay measurement error may exist in the Ac-Layer (FIG. 9D). The measurable centerlines of the pinwheel cut regions are defined by the Ac-layer template. The Ac-layer and Ag-layer edges may be separated a distance that enables avoiding proximity effects.

In all pinwheel configuration embodiments, the doubling spacers 102 in the first layer Ag-layer may be defined by filling essentially all, or all, of a processing quadrant. With the doubling spacers 102 covering a processing quadrant, the negative or positive tone bi-directional template masks 117 are provided with more latitude in positioning placement, as well as being provided with increased latitude in the fabrication size thereof. As a result of this range of mask 117 placement locations, the resultant cut spacers 102' of the invention may have an increased distance between the Ac-layer edge and the Ag-layer edge.

Figure 10:
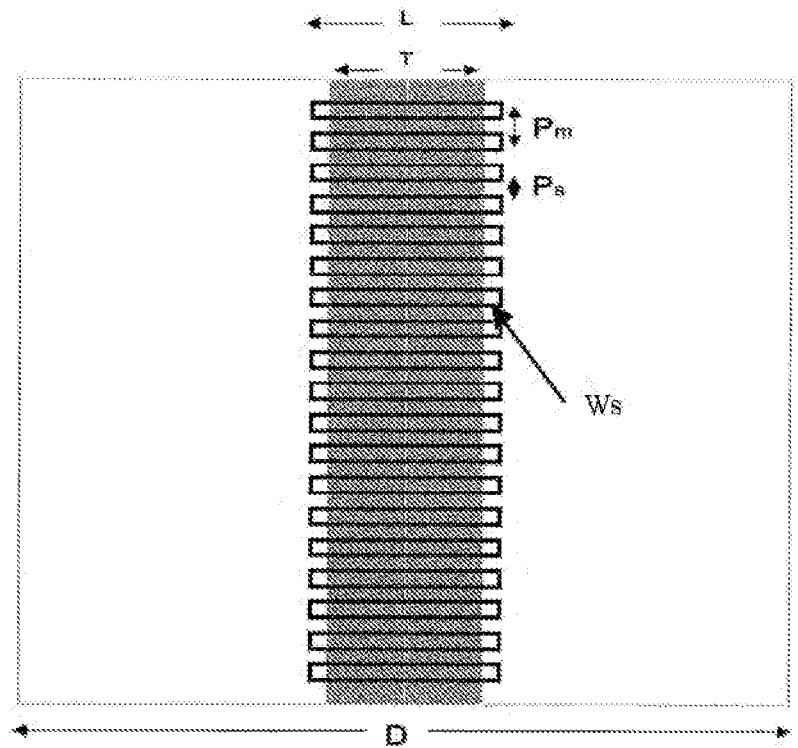
FIG. 10 illustrates a module of a positive tone pinwheel layout of the invention.

The various embodiments of the invention are suitable for a wide range of gratings, doubling spacers and cut spacers dimensions. While not meant to limit the invention, FIG. 10 shows nominal grating dimensions of a pinwheel configuration layout in accordance with one or more embodiments. The overall dimensions (D) of the mark module (or quadrant) may range from about 1-10 microns, and may be square. The template mask (T) may have a width ranging from about 0.1-1.0 microns. The grating length (L) minus the template width (L−T) may range from about 20-200 nm. The pitch of the mandrel grating (Pm) may range from about 70-150 nm, the pitch of the sidewall or DSA grating (Ps) may range from about 20-70 nm, and the width of the sidewall or doubling spacer grating lines (Ws) may range from about 5-10 nm.

Figure 11A:
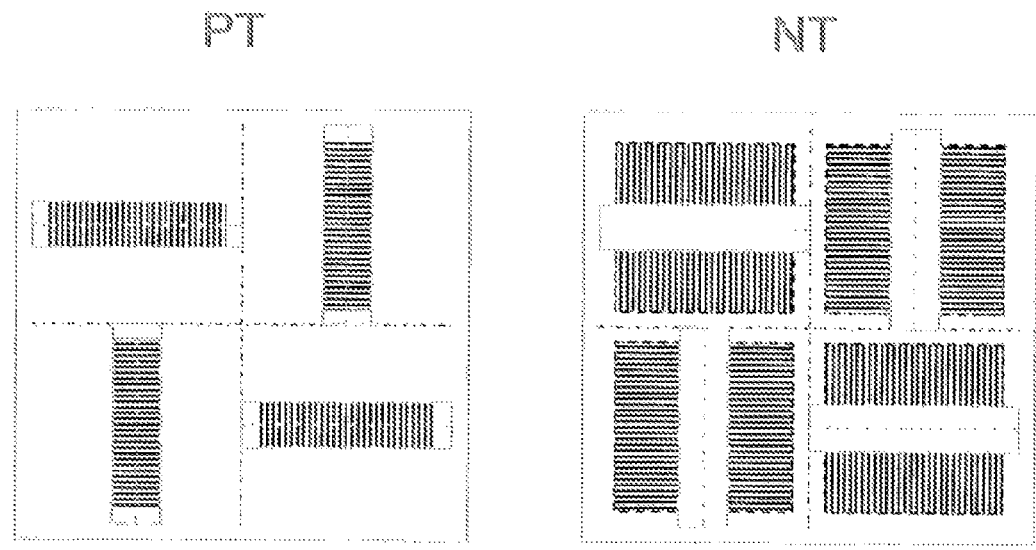
FIG. 11A illustrates complementary positive and negative pinwheel embodiments in accordance with the invention.
Figure 11B:
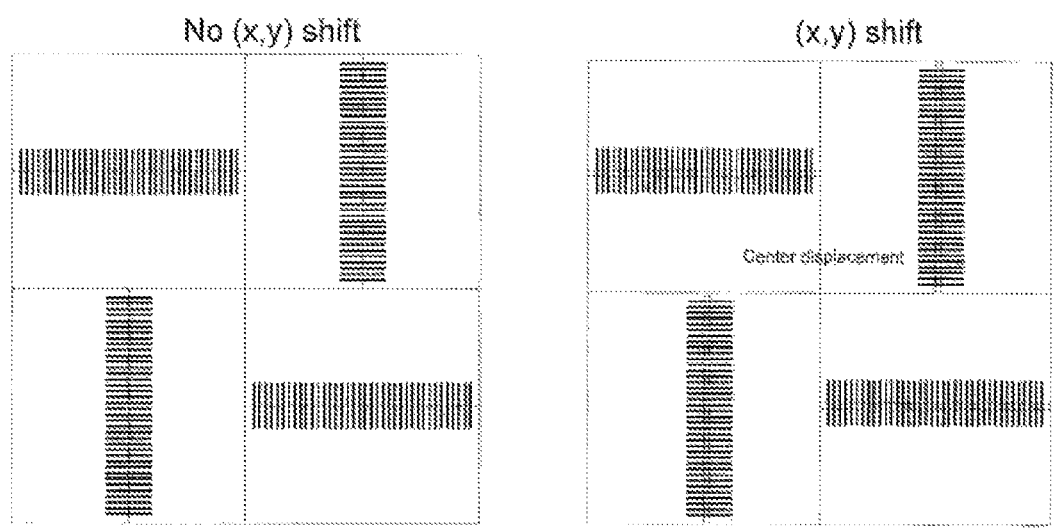
FIG. 11B illustrates the impact of cut mask registration error in a positive tone pinwheel resist example of the invention.

While the present invention has been described in conjunction with positive and negative tone template mask developments, it should be appreciated that both positive and negative tone mask developments may be used in combination with each other. For instance, FIG. 11A shows an example of a complementary pinwheel embodiment having both positive and negative tone developed cut spacer 102' regions in accordance with one or more embodiments of the invention. Again, the cut Ac-layer may or may not have registration error. As shown in FIG. 11B, the impact of a cut Ac-layer mask registration having no alignment error, as compared to a cut Ac-layer mask registration having alignment error, are shown in a positive tone example. The mark center is determined by the location of the pinwheel elements. The image showing x,y shift depicts that the mark center shifts with x,y misregistration of the cut mask with respect to the grating layer (i.e., the Ag-layer).

Referring to FIGS. 12-16, various other combinations of cut spacer 102' marks of the invention may be provided and aggregated in a single target that fits within the field of view of an image-based overlay metrology tool. As described further below, and with reference to FIG. 17, image-based overlay metrology tools may also be programmed and/or provided with software and/or logic for developing the cut spacer 102' marks of the invention.

Figure 12:
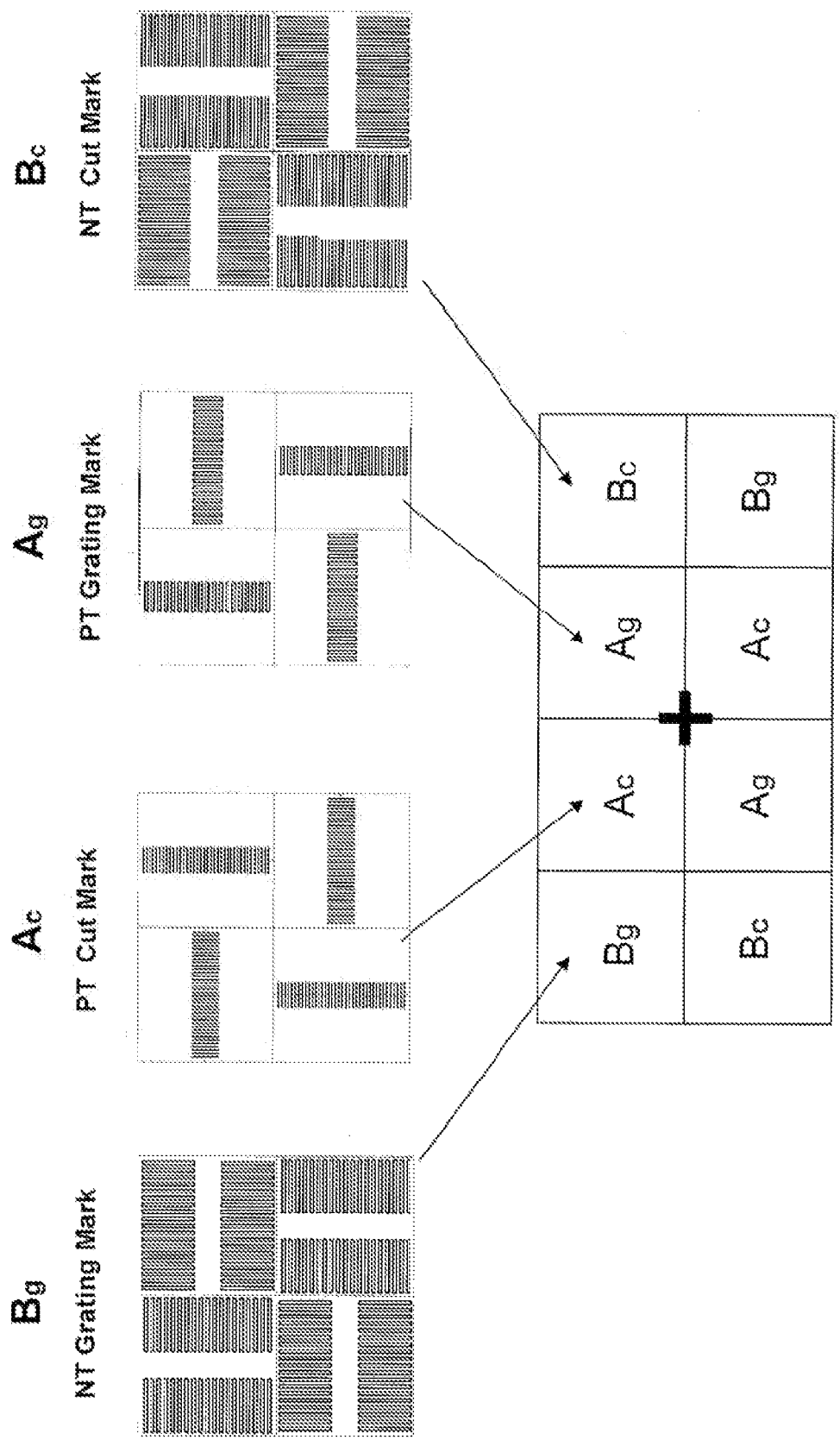

FIG. 12 shows an aggregated multi-layer overlay target having various bi-directional grating layer marks 102' of the invention in combination with each other. Selected marks and targets may be formed simultaneously, sequentially, or combinations thereof. The aggregated multi-layer overlay target includes negative tone cut doubling spacer 102 marks (e.g., third layer Bg-layer), positive tone cut spacer 102' marks (e.g., second layer Ac-layer), positive tone doubling spacer 102 marks (e.g., first layer Ag-layer), and negative tone cut spacer 102' marks (e.g., third layer Bc-layer). These various different bi-directonal grating layers (Bg-, Ac-, Ag- and Bc-layers) are aggregated into a single overlay target of 2 doubling spacer grating mark patterns 102 in combination with 2 cut spacer grating mark patterns 102'. The overlay target is provided with 2-fold symmetry about a common center shown by the central cross depicted in FIG. 12. The mark modules are dimensioned to enable target capture within the field of view of an image-based overlay metrology tool.

Figures 13A, 13B, 13C, 13D:
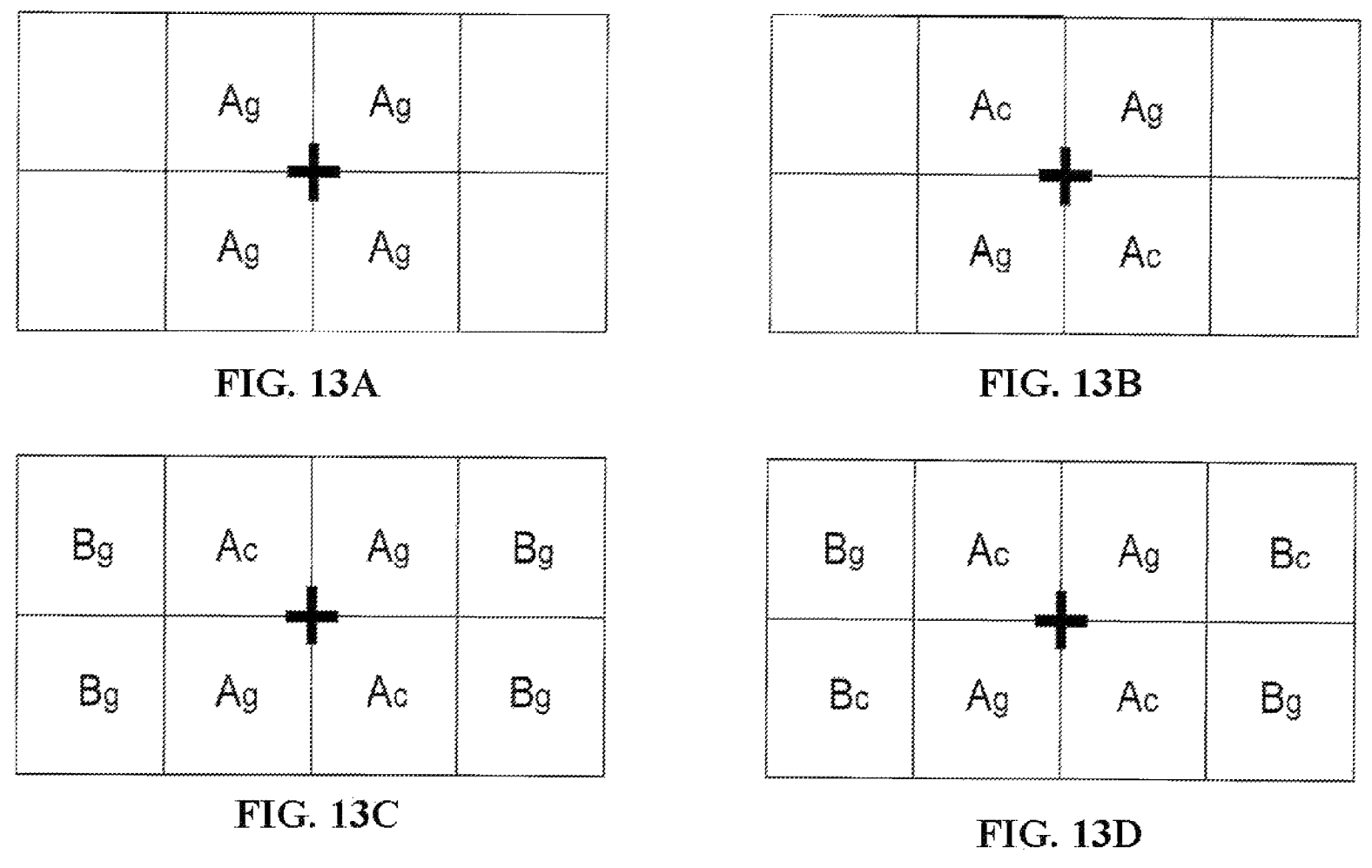

As further examples of the invention, FIGS. 13A-D show various patterned sequences for a 4-layer target with different grating layer marks. FIG. 13A shows the first Ag-layer pattern having doubling spacers, while FIG. 3B shows the cut spacers 102' fabricated from a subset of two symmetric Ag-layers using the template masks in accordance with the invention. These Ac-layers are symmetric about the center mark (the center cross) of the target pattern. After the second layer Ac-layer has been provided on the target in combination with the first grating Ag-layer, a subsequent (third) layer may be provided on the target. For instance, referring to FIG. 13C, doubling spacer grating layer of a third layer, Bg-layer, is fabricated on the target. In doing so a Bg mask is aligned to the Ag/Ac marks, and is then patterned to form the Bg-layer grating marks in the target. These Bg-layer grating marks may further be processed in accordance with the invention by forming cut spacer Bc-layer using a Bg template mask aligned to the Ag/Ac/Bg marks and patterning the Bc-layer marks by cutting a symmetric subset of the spacer Bg-layers. The end result of FIG. 13D is the 4-layer target with different grating layer marks.

Figures 14, 15:
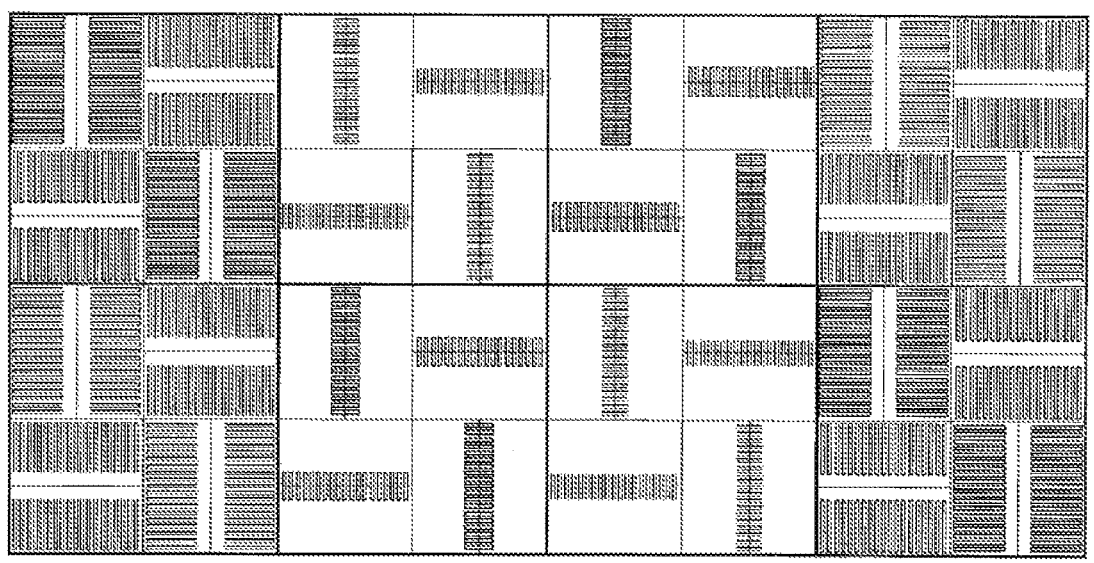

It should be appreciated that the process described herein, and shown in reference to the instant drawings, may be repeated for any number of patterns required on a desired target. For instance, the target pattern of FIGS. 13A-D may be provided with a plurality of symmetric layered targets having different grating layer marks (e.g., 6-layers, 8-layers, etc.). The targets may also be provided with more than 2 of each layer (Ac-, Ag-, Bg-, Bc-, etc.) For instance, FIG. 14 shows another example of a 4-layer target having a 4×4 target configuration whereby there are 4-fold of each grating layer Ac-, Ag-, Bg-, and Bc-layers that are symmetrically oriented around a center cross of the overlay target. The mark modules are dimensions to enable target capture within the field of view of an image-based overlay metrology tool.

Figure 16:
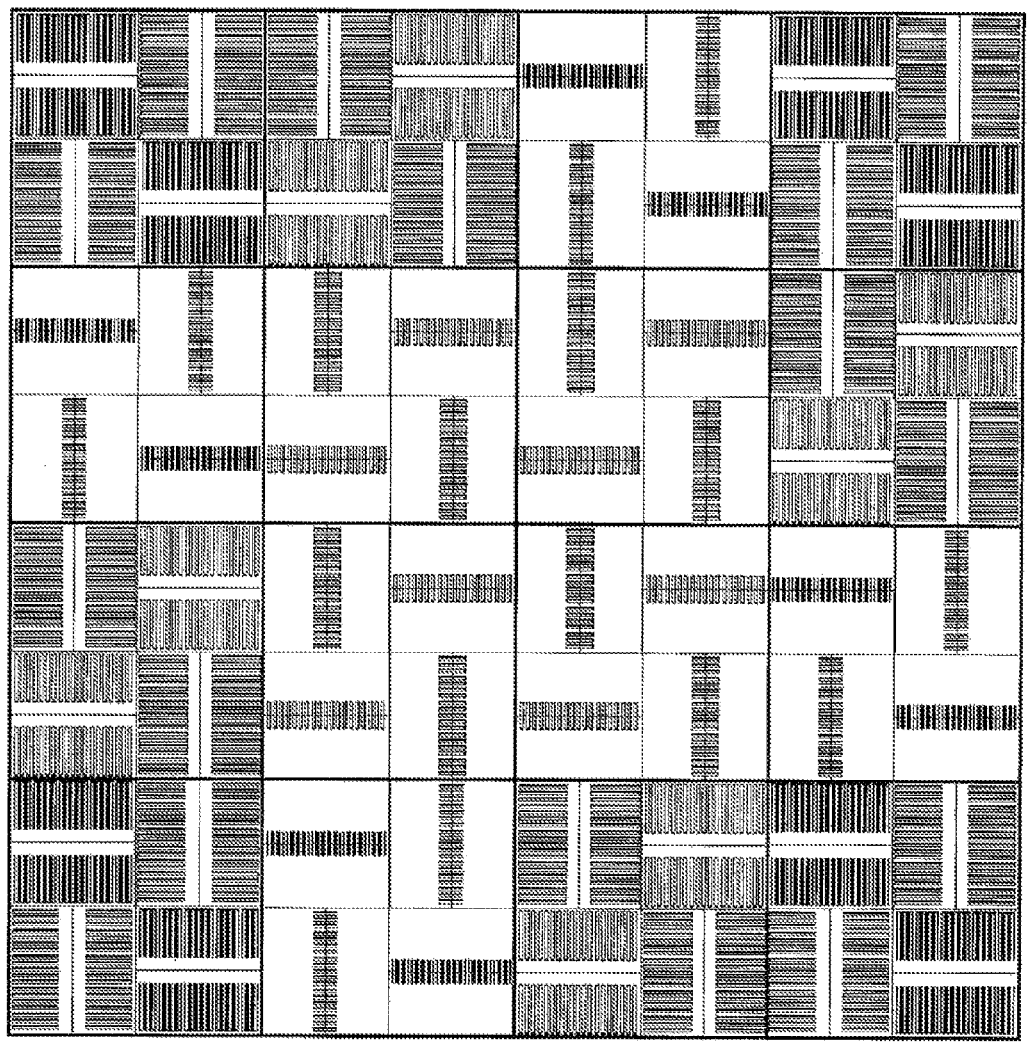

FIGS. 15 and 16 show various other embodiments of multi-fold combinations of grating layers (e.g., negative and/or positive tone Ac-, Ag-, Bg-, and Bc-layers) on a single overlay target. FIG. 15 shows a fully populated 4-layer 2×4 target, while FIG. 16 shows a fully populated 4-layer 4×4 target with 4-fold symmetry. These targets include both positive tone bi-directional Ag- and Ac-layers, in combination with negative tone bi-directional Bg- and Bc-layers. There is 2-fold symmetry about the common center, and the aggregate target may accommodate both known gratings in combination with the cut spacer grating marks of the invention.

In accordance with the various embodiments of the invention, methods of fabricating, and the cut spacer grating marks made by such methods, allow for increased complexity to be fabricated in overlay target patterns used to form circuit patterns and semiconductor devices. The invention enables the control and positioning of superimposed cut spacer layers with respect to grating lines for controlling alignment and overlay measurement errors for subsequently patterned grating layers and overlay targets. The various embodiments of the invention enable the formation of alignment and overlay reference marks for SIT processing that allows grating formation in both X and Y orientations in superimposed layers on the grating layer, and not just in the grating layer itself. Template masks are formed and exposed for etching of subsequent layer(s) to define shapes cut into gratings (i.e., spacers) that are necessary for circuit functionality and alignment and overlay metrology. The cut gratings (spacers) layers are used in the measuring and determining alignment and overlay errors in subsequently processed layers. The metrology shapes comprise edges cut perpendicular to the gratings (spacers) needed to determine the placement of the template pattern. Determination of placement error in the X and Y directions requires that gratings be formed in both X and Y orientations. The invention provides for the formation of cut layer reference marks.

As will be appreciated by one skilled in the art, aspects of the present invention may be embodied as systems, methods or computer program products. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, store, communicate, propagate, or transport a program for use by or in connection with an instruction execution system, apparatus, or device. Note that the computer usable or computer readable medium could even be paper or another suitable medium upon which the program is printed, as the program can be electronically captured via, for instance, optical scanning of the paper or other medium, then compiled, interpreted, or otherwise processed in a suitable manner, if necessary, and stored in a computer memory.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Figure 17:
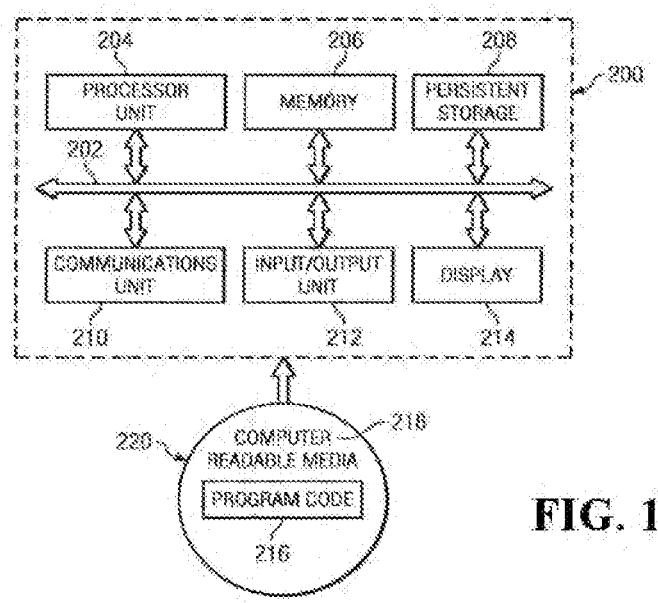
FIG. 17 illustrates a data processing system of certain embodiments of the invention.

The block diagram of FIG. 17 illustrates a data processing system of certain embodiments of the invention. The data processing system 200 is an example of a computing device, e.g., a computing device of a lithographic imaging apparatus and/or system, in which computer usable program code or instructions implementing the processes may be located. The various embodiments of the invention may be implemented using any hardware device or system capable of executing program code. The data processing system 200 may include communications fabric 202, which provides communications between processor unit 204, memory 206, persistent storage 208, communications unit 210, input/output (I/O) unit 212, and display 214.

A central processing unit (CPU) 204 serves to execute instructions for software that may be loaded into memory 206. Processor unit 204 may be a set of one or more processors or may be a multi-processor core, depending on the particular implementation. Further, processor unit 204 may be implemented using one or more heterogeneous processor systems in which a main processor is present with secondary processors on a single chip. As another illustrative example, processor unit 204 may be a symmetric multi-processor system containing multiple processors of the same type.

Memory 206 and persistent storage 208 are examples of storage devices. A storage device is any piece of hardware that is capable of storing information either on a temporary basis and/or a permanent basis. Memory 206, in these examples, may be, for example, a random access memory or any other suitable volatile or non-volatile storage device. Persistent storage 208 may take various forms depending on the particular implementation. For example, persistent storage 208 may contain one or more components or devices. For example, persistent storage 208 may be a hard drive, a flash memory, a rewritable optical disk, a rewritable magnetic tape, or some combination of the above. The media used by persistent storage 208 also may be removable. For example, a removable hard drive may be used for persistent storage 208.

Communications unit 210 provides for communications with other data processing systems or devices. Communications unit 210 may provide communications through the use of either or both physical and wireless communications links. Input/output unit 212 allows for input and output of data with other devices that may be connected to data processing system 200. For example, input/output unit 212 may provide a connection for user input through a keyboard and mouse. Further, input/output unit 212 may send output to a printer. Display 214 provides a mechanism to display information to a user.

Instructions for the operating system and applications or programs are located on persistent storage 208. These instructions may be loaded into memory 206 for execution by processor unit 204. The processes of the different embodiments may be performed by processor unit 204 using computer implemented instructions, which may be located in a memory, such as memory 206. These instructions are referred to as program code, computer usable program code, or computer readable program code that may be read and executed by a processor in processor unit 204. The program code in the different embodiments may be embodied on different physical or tangible computer readable media, such as memory 206 or persistent storage 208.

Program code 216 may be located in a functional form on computer readable media 218 that is selectively removable and may be loaded onto or transferred to data processing system 200 for execution by processor unit 204. Program code 216 (i.e., instructions) and computer readable media 218 form computer program product 220 in these examples. The computer readable media 218 may be in a tangible form, such as, for example, an optical or magnetic disc that is inserted or placed into a drive or other device that is part of persistent storage 208 for transfer onto a storage device, such as a hard drive that is part of persistent storage 208. In a tangible form, computer readable media 218 also may take the form of a persistent storage, such as a hard drive, a thumb drive, or a flash memory that is connected to data processing system 200. The tangible form of computer readable media 218 is also referred to as computer recordable storage media. In some instances, computer recordable media 218 may not be removable.

Alternatively, program code 216 may be transferred to data processing system 200 from computer readable media 218 through a communications link to communications unit 210 and/or through a connection to input/output unit 212. The communications link and/or the connection may be physical or wireless in the illustrative examples. The computer readable media also may take the form of non-tangible media, such as communications links or wireless transmissions containing the program code.

The flowchart(s) in the Figures illustrate the architecture, functionality, and operation of possible implementations of systems, methods and computer program products according to various embodiments of the present invention. In this regard, each block in a flowchart may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the flowchart illustration, and combinations thereof, can be implemented by special purpose hardware-based systems that perform the specified functions or acts, or combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of fabricating reference marks for lithography comprising:
   providing grating lines on a first layer;
   forming spacer gratings on the first layer around said grating lines so that said spacer gratings surround and double the frequency of said grating lines on said first layer;
   forming a template mask extending across and perpendicular to said spacer gratings residing around said grating lines; and
   etching a second layer using said template mask to superimpose at least a portion of said spacer gratings having double the frequency of said grating lines of said first layer into said second layer, thereby forming cut spacer gratings in said second layer.

2. The method of claim 1 wherein the template mask comprises a unidirectional mask extending in an x-direction respect to the grating lines.

3. The method of claim 2 wherein the template mask comprises a positive or negative tone template mask.

4. The method of claim 1 wherein the template mask comprises a unidirectional mask extending in a y-direction with respect to the grating lines.

5. The method of claim 4 wherein the template mask comprises a positive or negative tone template mask.

6. The method of claim 1 further including covering the first layer with one or more films, the upper most film comprising a resist layer, the resist layer having said template mask.

7. The method of claim 1 wherein the template mask comprises a bi-directional template mask extending in both an x-direction and y-direction with respect to the grating lines.

8. The method of claim 7 wherein the bi-directional template mask extends at 90° angles in both the x-direction and y-direction with respect to the grating lines.

9. The method of claim 7 wherein the bi-directional template mask comprises a cross pattern bi-directional template mask.

10. The method of claim 9 wherein the cross pattern bi-directional template mask comprises a positive or negative tone template mask.

11. The method of claim 7 wherein the bi-directional template mask comprises a pinwheel pattern bi-directional template mask.

12. The method of claim 11 wherein the pinwheel pattern bi-directional template mask comprises a positive or negative tone template mask.

13. The method of claim 1 further the steps:
  forming one or more additional template masks extending across and perpendicular to one or more additional spacer gratings of one or more additional layers; and
  etching other cut spacer gratings in still further other layers by using said one or more additional template masks to superimpose at least a portion of said one or more additional spacer gratings into said still further other layers.

14. A method of determining positioning error between lithographically produced integrated circuit fields comprising:
  providing grating lines on a first layer;
  forming rectangular shaped spacer gratings on the first layer around said grating lines, said rectangular shaped spacer gratings surrounding and at least double the frequency of said grating lines on said first layer;
  forming a template mask extending across and perpendicular to said spacer gratings surrounding said grating lines;
  etching a second layer using said template mask to superimpose at least a portion of said spacer gratings having double the frequency of said grating lines of said first layer into said second layer, thereby forming cut spacer gratings in said second layer; and
  measuring a position of the cut spacer gratings in said second layer relative to the grating lines on the first layer to determine any alignment error.

15. The method of claim 14 further including using any detected alignment error for processing subsequent layers.

16. The method of claim 14 further including aligning a third layer to said cut spacer gratings in said second layer to form third layer spacer gratings, and further determining alignment error between said third layer spacer gratings and said cut spacer gratings in said second layer.

17. The method of claim 14 further including the steps:
  providing other grating lines on a third layer;
  forming other spacer gratings on the third layer around said other grating lines so that said other spacer gratings surround and double or quadruple, the frequency of said other grating lines on said third layer;
  forming a second template mask extending across and perpendicular to said other spacer gratings on said third layer; and
  etching a fourth layer using said second template mask to superimpose at least a portion of said other spacer gratings of said third layer into said fourth layer, thereby forming other cut spacer gratings in said fourth.

18. The method of claim 17 further including the step of measuring positioning of the other cut spacer gratings in said fourth layer relative to the grating lines on the first layer to determine any alignment error.

19. The method of claim 17 further including the step of measuring positioning of the other cut spacer gratings in said fourth layer relative to the other grating lines on the third layer to determine any alignment error.

* * * * *